United States Patent [19]

Hascoe et al.

[11] 4,109,818

[45] Aug. 29, 1978

[54] HERMETIC SEALING COVER FOR A CONTAINER FOR SEMICONDUCTOR DEVICES

[75] Inventors: Norman Hascoe, Larchmont; Samuel W. Levine, Roslyn, both of N.Y.

[73] Assignee: Semi-Alloys, Inc., Mount Vernon, N.Y.

[21] Appl. No.: 583,463

[22] Filed: Jun. 3, 1975

[51] Int. Cl.² .............................................. B65D 39/00
[52] U.S. Cl. .................................... 220/200; 220/457; 220/359; 220/363; 174/52 S; 156/330; 156/306
[58] Field of Search ............... 220/241, 242, 64, 200, 220/359, 363; 206/813; 174/52 S; 156/60, 330, 306

[56] References Cited

U.S. PATENT DOCUMENTS

| | | | |
|---|---|---|---|
| 2,887,737 | 5/1959 | Prescott | 220/359 X |
| 3,120,321 | 2/1964 | McCuskey et al. | 220/64 |
| 3,190,952 | 6/1965 | Bitko | 220/200 X |
| 3,778,683 | 12/1973 | Buice et al. | 174/52 S X |
| 3,825,148 | 7/1974 | Hunter et al. | 174/52 S X |
| 3,874,549 | 4/1975 | Hascoe | 220/378 X |
| 3,890,448 | 6/1975 | Ito | 220/64 |

OTHER PUBLICATIONS

Industrial Adhesives by Evans 8-28-73.

*Primary Examiner*—William Price
*Assistant Examiner*—Joseph M. Moy
*Attorney, Agent, or Firm*—Laurence B. Dodds

[57] ABSTRACT

A hermetic sealing-cover unit for a container for semiconductor devices is fabricated by applying to the cover a solution of a thermosetting plastic material in a drying solvent to form a thin plastic coating on the cover. The solution preferably is a 10% concentration by weight of epoxy resin in a solvent comprising a mixture of methanol, ethylene dichloride, and dioxane in the ratio of 50:35:15. The cover element is of a material impervious to moisture and air, preferably a material of the group which includes metal, glass, quartz, and ceramic. A sealing ring is formed of substantially chemically unreacted thermosetting plastic material, preferably the same as the plastic material of the cover coating, and is of a size substantially to register with the periphery of the cover. The ring is then pressed into engagement with the plastic coating on the cover at ambient temperature, while the coating is still tacky, and the drying of the coating on the cover is completed to adhere the ring to the cover.

3 Claims, 2 Drawing Figures

HERMETIC SEALING COVER FOR A CONTAINER FOR SEMICONDUCTOR DEVICES

BACKGROUND OF THE INVENTION

This invention relates to a hermetic sealing cover for a container and, more particularly, to a sealing cover adapted to seal a semiconductor device in the cavity of a body in which the cover facing the bonding wires of the semiconductor device is insulated so that bonding wires accidentally touching the cover, if metal, will not cause an electrical short thereby making the semiconductor device inoperable.

There are described and claimed in U.S. Pat. Nos. 3,823,468 and 3,874,549 a metallic sealing cover and preattached metallic solder preform which is then applied to cover the cavity in a metallic or ceramic container for a semiconductor device and is attached thereto by heating the device to the fusing point of the solder, thereby permanently hermetically sealing the container. Such covers are entirely satisfactory but are of relatively high cost.

In the semiconductor industry there have come into use various plastic preforms as a substitute for the metallic solder preform for sealing the cover to the semiconductor container. These plastic preforms have been used in sealing covers and containers, each of which may be of metal, ceramic, quartz, or plastic and used in various combinations. The principal advantage of the use of the plastic preform is low cost. It also has the advantage of sealing some materials to each other which cannot be accomplished with a metallic solder. Conventionally, the plastic preform is placed in registry with the cavity opening and the cover is placed in registry with the assembly and sealing is accomplished by the application of heat and pressure. To a small extent, the cavity openings have been sealed by the use of a plastic preform and cover assembly in which the plastic preform has been preattached to the cover by applying heat.

When using plastic sealing performs as described with a cover which is an electrically conductive metal, the area of the cover surrounded by the plastic preform and which faces the inside of the cavity after sealing is exposed. Should any of the connecting wires which are attached to the active semiconductor device come in contact with the exposed metallic surface of the cover, an electrical short may result which renders the semiconductor device nonfunctonal and useless.

Preattaching the plastic preform to the cover by heat, as described, gives rise to a second disadvantage, namely, the degrading effect the application of heat has on the ability of certain types of plastic preforms effectively to form a seal to the surface surrounding the cavity in the semiconductor container. Such plastic preforms are necessarily of thermosetting plastic material in which a chemical reaction takes place when heat is first applied such that the material becomes irreversibly at least partially hardened. If the thermosetting plastic is not in contact with the surface to which it is to be sealed when heating takes place, the exposed surface hardens and loses its adhesive quality. When a thermosetting plastic preform such as epoxy is preattached to the cover by applying heat, adhesion is obtained between the cover and the surface of the preform in contact with the cover. However, the other surface of the preform also becomes at least partially hardened and loses some or all of its adhesive qualities. When the cover-preform unit is placed in registry on the semiconductor package cavity and heat is applied for final sealing, a degraded seal is obtained between the semiconductor container and the thermosetting plastic preform. As a result, many such seals leak, thereby nullifying the desired goal of forming a durable hermetic barrier between the active semiconductor element in the container and the ambient atmosphere. Often, the adhesive quality of such a preattached plastic preform is so degraded that the cover with its preform falls off the package with the slightest mechanical distrubance.

It is an object of the present invention, therefore, to provide a hermetic sealing cover and preattached plastic sealing preform which completely eliminates one or both of the above-described disadvantages of prior plastic sealing cover-preform units of the type described.

It is another object of the invention to provide a new and improved hermetic sealing cover and preattached plastic sealing preform which is of low cost and which provides a durable hermetic seal for a semiconductor package.

SUMMARY OF THE INVENTION

In accordance with the invention, a prefabricated hermetic sealing-cover unit for a heat-sealable container for a semiconductor device comprises a cover element having upper and lower surfaces and being of a material impervious to moisture and air, a thin coating of a substantially chemically unreacted thermosetting plastic material adhered to the lower surface of the cover element without heat, and a preformed sealing ring of substantially chemically unreacted thermosetting plastic material adhered to the coated surface of, and in registry with the periphery of, the cover element without heat, such prefabricated hermetic sealing-cover unit being responsive to heat to fuse the sealing ring and coating to the cover element.

For a better understanding of the present invention, together with other and further objects thereof, reference is had to the following description, taken in connection with the accompanying drawing, while its scope will be pointed out in the appended claims.

BRIEF DESCRIPTION OF THE DRAWING

FIG. 1 is a schematic diagram illustrating the method of fabricating a hermetic sealing cover in accordance with the invention, while

DESCRIPTION OF THE PREFERRED EMBODIMENT

Figure 1:
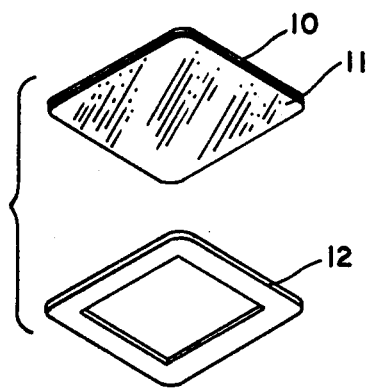

Referring now to FIG. 1, there is illustrated schematically a method of fabricating a prefabricated hermetic sealing-cover unit for a heat-sealable container for a semiconductor device comprising a cover element 10 having upper and lower surfaces, to the lower surface of which is applied a solution of a thermosetting plastic material in a drying solvent to form a thin plastic coating 11 adhered to the cover element without heat. Such coating is preferably a solution of epoxy resin in a solvent comprising a mixture of methanol, ethylene dichloride, and dioxane, the concentration of the coating solution preferably being substantially 10% plastic material by weight. The composition of the solvent is:

| | |
|---|---|
| Methanol | 30% – 70% |
| Ethylene dichloride | 20% – 50% |
| Dioxane | 5% – 20% |

The preferred composition of the solvent is substantially methanol 50%, ethylene dichloride 35%, and dioxane 15%.

There is also formed a ring 12 of substantially chemically unreacted thermosetting plastic material, preferably of the same composition as the plastic material of the coating 11 and of a size substantially to register with the periphery of the cover 10. The ring 12 may be punched from a strip or sheet of substantially chemically unreacted epoxy resin. The ring 12 is pressed into engagement with the plastic coating 11 on the cover 10 at ambient temperature while the coating is still tacky. The drying of the coating is then completed so that the ring 12 adheres firmly to the coating 11.

Figure 2:
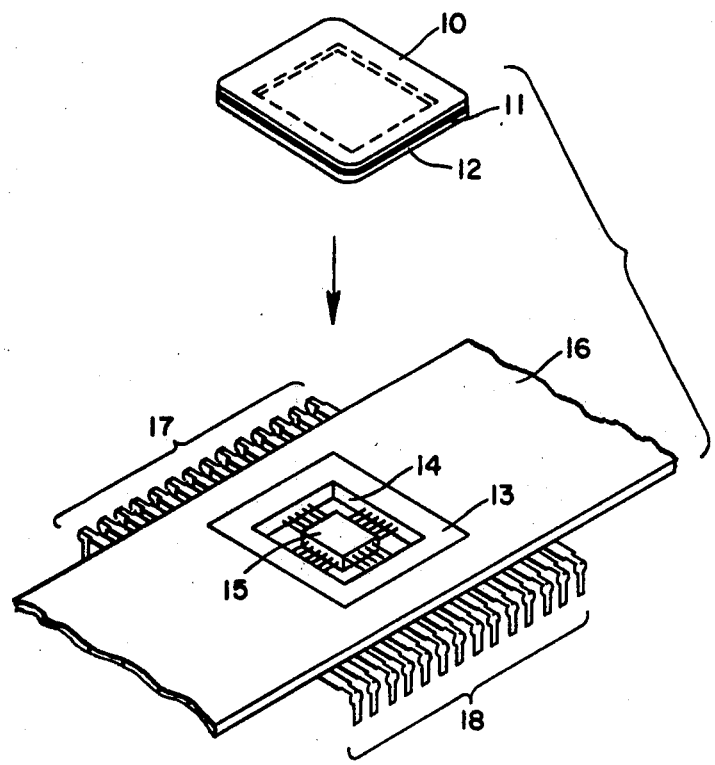
FIG. 2 is a schematic diagram illustrating the method of assembling and sealing a semiconductor package utilizing the hermetic sealing cover of the invention.

Referring now to FIG. 2, at the top is shown a hermetic sealing-cover unit 10,11,12, fabricated as described above, the cover element 10 being of a material impervious to moisture and air and preferably of a material which is a member of the group comprising metal, glass, quartz, and ceramic. The sealing-cover unit is attached to a container 13 having a cavity 14 in which is disposed a semiconductor device 15. As indicated, the container 13 is carried by an enlarged supporting member 16 which, in turn, carries terminal pins 17, 18 sealed in the supporting member 16 and terminating in the leads to the semiconductor device 15. The assembly of the cover 10, 11, 12 and the container 13 is then passed through a suitable belt furnace for heating the plastic coating 11 on the cover and the plastic sealing ring 12 to cause the chemical reaction for fusing the sealing ring 12 to the cover element 10 and to the container 13.

By the use of the coating 11 of substantially chemically unreacted thermosetting plastic material on the cover element 10 and the use of the sealing ring 12 of substantially chemically unreacted thermosetting plastic material as described, their fusing and adhering characteristics are not degraded by preliminary heating for attaching the sealing ring 12 to the cover element 10 as has been done heretofore, thereby ensuring a reliable and durable hermetic seal between the cover unit and the semiconductor container 13. In addition, the presence of the coating 11 of chemically reacted plastic material over the inside surface of the cover, if metal, avoids any possible shorting of conductive bonding wires inside the container that may be associated with the semiconductor device 15.

While there has been described what is, at present considered to be the preferred embodiment of the invention, it will be obvious to those skilled in the art that various changes and modofications may be made therein, without departing from the invention, and it is, therefore, aimed in the appended claims to cover all such changes and modifications as fall within the true spirit and scope of the invention.

What is claimed is:

1. A prefabricated hermetic sealing-cover unit for a heat-sealable container having a semiconductor device therein comprising:

a cover element having upper and lower surfaces and being of a material impervious to moisture and air;

a thin coating of substantially chemically unreacted thermosetting plastic matter adhered to the lower surface of said cover element without heat;

and a preformed sealing ring of substantially chemically unreacted thermosetting plastic material adhered to the coated surface of, and in registry with periphery of, said cover element without heat, said prefabricated hermetic sealing-cover unit being responsive to heat to fuse the sealing ring and coating to the cover element.

2. A hermetic sealing-cover unit in accordance with claim 1 in which the cover element is of a material which is a member of the group metal, glass, quartz, and ceramic.

3. A hermetic sealing-cover unit in accordance with claim 1 in which the thin cover coating and the sealing ring are of substantially chemically unreacted epoxy resin.

* * * * *